(12) United States Patent
Kubba et al.

(10) Patent No.: US 11,967,816 B2
(45) Date of Patent: Apr. 23, 2024

(54) FAULT-PROTECTED ANALOG AND DIGITAL INPUT/OUTPUT INTERFACE

(71) Applicant: Texas Instruments Incorporated, Dallas, TX (US)

(72) Inventors: Ishaan Kubba, Delhi (IN); Sreeram Nasum Subramanyam, Bengaluru (IN); Shishir Goyal, Bengaluru (IN); Deep Banerjee, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 165 days.

(21) Appl. No.: 17/244,692

(22) Filed: Apr. 29, 2021

(65) Prior Publication Data
US 2022/0352706 A1    Nov. 3, 2022

(51) Int. Cl.
*H02H 3/00*     (2006.01)
*H03K 5/01*     (2006.01)
*H03K 5/24*     (2006.01)

(52) U.S. Cl.
CPC ............. *H02H 3/003* (2013.01); *H03K 5/01* (2013.01); *H03K 5/24* (2013.01)

(58) Field of Classification Search
CPC .......... H02H 3/003; H02H 3/38; H02H 3/382; H02H 3/20; H02H 3/28; H02H 3/325; H02H 3/352; H02H 9/046; H02H 3/36
USPC ......................................... 361/84, 85, 86, 87
See application file for complete search history.

(56) References Cited

U.S. PATENT DOCUMENTS

| | | | | |
|---|---|---|---|---|
| 6,654,221 | B2* | 11/2003 | Noma | H05B 41/2855 361/91.1 |
| 6,876,245 | B2 | 4/2005 | de Buda et al. | |
| 8,339,181 | B2* | 12/2012 | Wedin | H03K 17/0822 327/434 |
| 11,271,562 | B2 | 3/2022 | Narayanasamy et al. | |

OTHER PUBLICATIONS

Notice of Allowance in corresponding U.S. Appl. No. 17/586,552, dated Nov. 9, 2022, 21 pgs.

* cited by examiner

*Primary Examiner* — Hai L Nguyen
(74) *Attorney, Agent, or Firm* — John R. Pessetto; Frank D. Cimino

(57) ABSTRACT

An input/output (I/O) interface includes a resistance-to-current (R/I) converter; an internal resistor; first, second, and third current sources; first and second diodes; and a comparator. The R/I converter is coupled to an I/O pin and generates an output current based on an external resistance at the I/O pin during an analog operating mode. The internal resistor is coupled to the I/O pin and to ground. The first current source is coupled to the R/I converter circuit. The first diode is coupled to the R/I converter and to the I/O pin. The second current source is coupled to the R/I converter and the first diode and to ground. The second diode is coupled to the I/O pin and to the third current source. The comparator has inputs coupled to the I/O pin and to a reference voltage, and outputs a control signal indicative of a digital operating mode.

20 Claims, 3 Drawing Sheets

FAULT-PROTECTED ANALOG AND DIGITAL INPUT/OUTPUT INTERFACE

BACKGROUND

Many electronic devices incorporate both analog and digital modes of operation. For example, some transceivers use one or more digital communication standards to transmit and receive data in the digital domain as well as analog communication standards such as on-off keying (OOK) modulation to transmit and receive data in the analog domain. However, it can be difficult to control both analog and digital operating modes via a single pin. Incorporating a first unique pin for control of analog operating modes and a second unique pin for control of digital operating modes increases the package size and control complexity for the device.

SUMMARY

A programmable input/output (I/O) interface having an I/O pin includes a resistance-to-current (R/I) converter; an internal resistor; first, second, and third current sources; first and second diodes, and a comparator. The R/I converter is coupled to the I/O pin and generates an output current based on an external resistance at the I/O pin during an analog operating mode. The internal resistor is coupled to the I/O pin and to ground. The first current source is coupled to the R/I converter and outputs a limiting current to prevent shoot through current in response to the I/O pin being coupled to ground. The first diode is coupled to the R/I converter and to the I/O pin. The second current source is coupled to the R/I converter and the first diode, and to ground. The second diode is coupled to the I/O pin and to the third current source. The comparator has a positive input coupled to the I/O pin and a negative input coupled to a reference voltage, and outputs a control signal indicative of a digital operating mode.

In some implementations, the external resistance at the I/O pin is between an upper threshold resistance and a lower threshold resistance during the analog operating mode, and greater than the upper threshold resistance or less than the lower threshold resistance during the digital operating mode. In some example embodiments, the reference voltage is a first reference voltage, and the R/I converter includes an error amplifier and a current mirror. The error amplifier has a positive input coupled to the I/O pin and a negative input coupled to a second reference voltage, and outputs a difference between a voltage on the I/O pin and the second reference voltage. The current mirror is coupled to the output of the error amplifier, the first diode, and the first current source, and outputs the output current of the R/I converter.

The R/I converter can also include a compensation loop coupled to the output of the error amplifier that compensates for a capacitance on the I/O pin. In some embodiments, the compensation is a first compensation loop, and the upper and lower threshold resistances define a recommended range of resistances for the analog operating mode. The R/I converter also includes a second compensation loop coupled to the output of the error amplifier. The first compensation loop compensates for the capacitance on the I/O pin for a first subset of the recommended range of resistances, and the second compensation loop compensates for the capacitance on the I/O pin for a second subset of the recommended range of resistances. The first and second subsets of the recommended range of resistances can be overlapping.

In some implementations, the comparator is a first comparator, the reference voltage is a first reference voltage, the control signal is a first control signal, and the digital operating mode is a first digital operating mode. The I/O interface also includes a second comparator with a positive input coupled to the I/O pin and a negative input coupled to a second reference voltage. The second comparator outputs a second control signal indicative of a second digital operating mode. During the first digital operating mode, the external resistance is less than a threshold resistance for the first digital operating mode and coupled the I/O pin to a supply voltage rail. During the second digital operating mode, the external resistance is greater than the upper threshold resistance, and a voltage on the I/O pin is determined by the third current source, the internal resistor, and the external resistance.

In some example embodiments, the I/O interface also includes a third comparator with a positive input coupled to the I/O pin and a negative input coupled to a third reference voltage. The third comparator outputs a third control signal indicative of a third digital operating mode. During the third digital operating mode, the external resistance is less than a threshold resistance for the third digital operating mode and couples the I/O pin to ground.

BRIEF DESCRIPTION OF THE DRAWINGS

For a detailed description of various examples, reference will now be made to the accompanying drawings in which.

The same reference numerals are used in the drawings to designate the same or similar (by function and/or structure) features.

DETAILED DESCRIPTION

The disclosed programmable input/output (I/O) interfaces enable both analog and digital control signals on a single I/O pin. While an external resistance on the I/O pin is within a recommended range of resistances defined by upper and lower threshold resistances, the I/O interface operates in the analog mode of operation and generates an analog control signal which can be used to adjust operation of other circuits, such as to tune an oscillator or a bandpass filter for a transceiver. While the external resistance on the I/O pin is outside the recommended range of resistances, the I/O interface operates in a digital mode of operation and generates a digital control signal to indicate which digital operating mode the device should operate in.

The disclosed I/O interfaces combine both analog and digital control signals on a single pin. In addition, because analog current control is tied to the accuracy of the external resistance, the effect of spread due to manufacturing tolerances in the external resistance can be reduced by using a high-precision external resistor. Further, the disclosed I/O interfaces incorporate reverse current protection and shoot-through current limitations with series blocking diodes and a current source, respectively.

Figure 1:
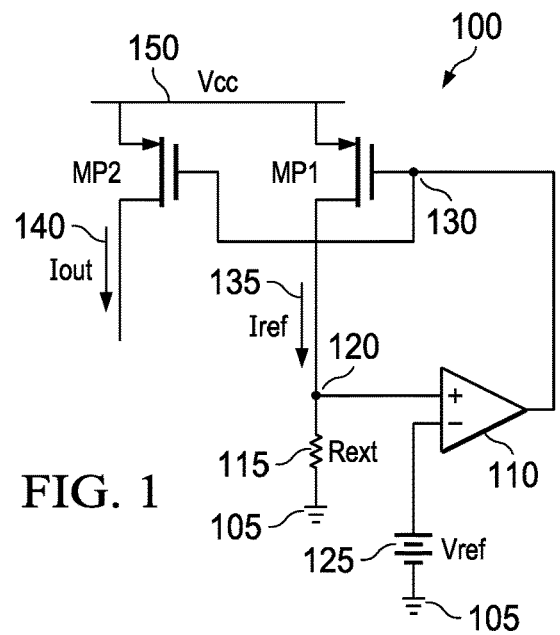
FIG. 1 is a circuit diagram illustrating a resistance-to-current converter configured to generate a tunable output current for control of an analog circuit.

FIG. 1 illustrates an example resistance-to-current (R/I) converter 100 configured to generate a tunable output current for control of an analog circuit, such as for tuning an oscillator or a bandpass filter in an on-off keying (OOK) modulation transceiver. The R/I converter 100 includes an error amplifier 110, an external resistor Rext 115, a reference voltage source Vref 125, and metal oxide semiconductor field-effect transistors (MOSFETs) MP1 and MP2.

In this example, MP1 and MP2 are p-type MOSFETs (PMOS). In other examples, one or more of MP1 and MP2 are n-type MOSFETs (NMOS) or bipolar junction transistors (BJTs). A BJT includes a base corresponding to a gate terminal, and a collector and an emitter corresponding to the drain and source terminals. The base of the BJT and the gate terminal of a MOSFET are also called control inputs. The collector and emitter of a BJT and the drain and source terminals of a MOSFET are also called current terminals.

Vref 125 is coupled to a negative input of error amplifier 110, and a positive input of error amplifier 110 is coupled to an I/O pin 120. In some example embodiments, Vref 125 is generated external to device 100 and is connected to error amplifier 110 by a separate pin. Rext 115 is coupled to the I/O pin 120 and to common mode voltage 105 (e.g., ground). An output of error amplifier 110 is coupled to the gate terminals of MP1 and MP2 at node 130. The source terminals of MP1 and MP2 are coupled to a supply voltage rail Vcc 150 (e.g., 5 volts). In some example embodiments, Vcc is generated external to device 100 and is connected to the sources of MP1 and MP2 by a pin. The drain terminal of MP1 is coupled to I/O pin 120. The drain of MP2 is connected to an analog circuit (not shown) and provides the output current Iout 140 as a control signal to the analog circuit.

The resistance of Rext 115 is between a lower threshold resistance Rthr(low) and an upper threshold resistance Rthr(high) and chosen to implement a desired output current Iout 140. The lower threshold resistance Rthr(low) and the upper threshold resistance Rthr(high) define a recommended range of resistances for an analog operating mode, for example a recommended range of resistances to implement a desired carrier frequency for an OOK modulation transceiver. The R/I converter 100 maintains a substantially constant voltage on the I/O pin 120 at approximately Vref 125.

Error amplifier 110 amplifies a difference between the reference voltage Vref 125 and a voltage across Rext 115 due to a reference current Iref 135. While there is little difference between Vref 125 and a voltage across Rext 115, the output of error amplifier 110 applied to the gate terminals of MP1 and MP2 causes MP1 and MP2 to turn on and act as closed switches. The reference current Iref 135 is able to flow from the supply voltage rail Vcc 150 through MP1 to I/O pin 120 and Rext 115. The configuration of MP1 and MP2 acts as a current mirror, and the reference current Iref 135 through MP1 is mirrored through MP2. The output current Iout 140 at the drain terminal of MP2 varies based on the resistance of Rext 115 and can be used to control an analog circuit (not shown).

Figure 2:
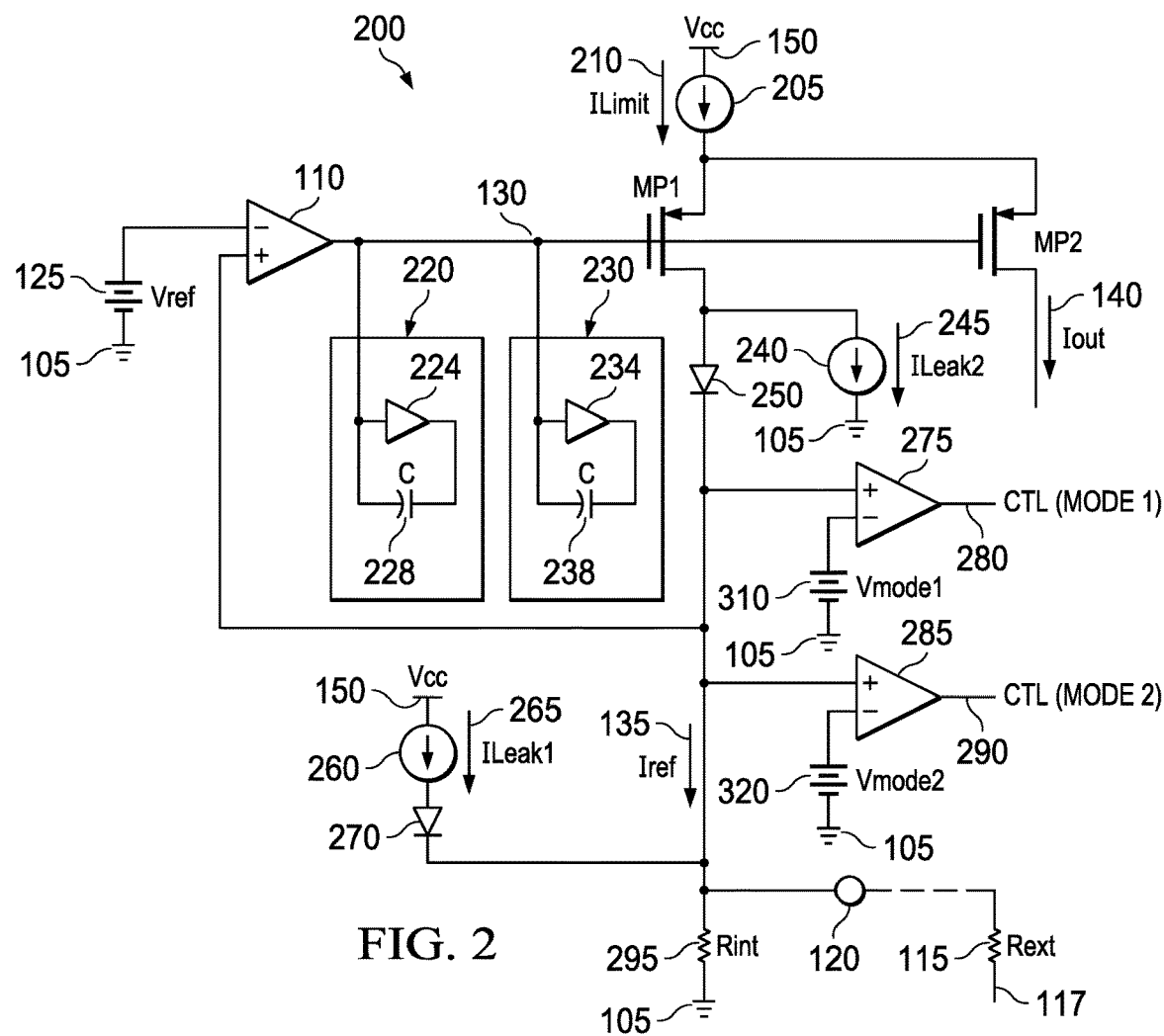
FIG. 2 is a circuit diagram illustrating a programmable input/output interface configured to support an analog mode of operation and two digital modes of operation on a single input/output pin.

FIG. 2 illustrates an example programmable I/O interface 200 configured to support an analog mode of operation and two digital modes of operation on an I/O pin 120. For ease of illustration, I/O interface 200 is described herein with reference to R/I converter 100 shown in FIG. 1. In addition, I/O interface 200 includes two compensation loops 220 and 230, current sources 205, 240, and 260, diodes 250 and 270, comparators 275 and 285, reference voltage sources Vmode1 310 and Vmode2 320 which are described further with respect to FIG. 3, and internal resistor Rint 295 coupled to I/O pin 120 and to node 117. Node 117 is coupled to a common mode voltage 105 (e.g., ground) in some implementations, to the supply voltage rail Vcc 150 in some implementations, to other supply voltages greater than or less than Vcc 150 in some implementations, and the like.

Current source 205 is coupled between the supply voltage rail Vcc 150 and the source terminals of MP1 and MP2 and generates a limiting current ILimit 210. Current source 205 and the limiting current ILimit 210 prevent shoot-through current in response to I/O pin 120 being shorted to ground 105. Compensation loops 220 and 230 are coupled to the output of error amplifier 110 and the gate terminals of MP1 and MP2 at node 130, and are out-of-loop Miller compensation circuits, also called Blakiewicz compensation circuits, used to compensate for capacitances on I/O pin 120. In other implementations, other types of capacitance compensation circuits may be used.

Compensation loop 220 includes a buffer 224 and a capacitor C 228, and compensation loop 230 includes a buffer 234 and a capacitor C 238. In compensation loop 220, an input of buffer 224 is coupled to node 130. A first terminal of capacitor C 228 is coupled to the output of buffer 224, and a second terminal of capacitor C 228 is coupled to the input of buffer 224 and node 130. In compensation loop 230, an input of buffer 234 is coupled to node 130. A first terminal of capacitor C 238 is coupled to the output of buffer 234, and a second terminal of capacitor C 238 is coupled to the input of buffer 234 and node 130.

The difference between the reference voltage Vref 125 and a voltage across Rext 115 output from error amplifier 110 is input to buffers 224 and 234. The outputs of buffers 224 and 234 are used to charge capacitors C 228 and 238, respectively, which slow the response of I/O interface 200 to capacitance on I/O pin 120 and improve the stability of I/O interface 200. The capacitances of C 228 and C 238 can be chosen to provide compensation across the recommended range of resistances Rthr(low) to Rthr(high). For example where Rthr(high) is fifty times Rthr(low), compensation loop 220 compensates for resistances between Rthr(low) and ten times Rthr(low). Compensation loop 230 compensates for resistances between seven times Rthr(low) and Rthr(high).

By using two staggered and overlapping compensation loops, I/O interface 200 can appropriately compensate across the full recommended range of resistances. Compensation loops 220 and 230 also improve the power supply rejection ratio (PSRR) of I/O interface 200 relative to other kinds of compensation techniques such as Miller compensation techniques because there is no coupling capacitor between the input and output of error amplifier 110.

Current source 240 is coupled to the drain terminal of MP1 and to ground 105 and generates a leakage current ILeak2 245. Current source 260 is coupled to the supply voltage rail Vcc 150 and generates a leakage current ILeak1 265. Internal resistor Rint 295 is coupled to I/O pin 120 and to ground 105. As the resistance of Rext 115 increases above the upper threshold resistance Rthr(high) for the recommended range of resistances and an analog operating mode, the currents Iref 135 and Iout 140 generated by R/I converter 100 decrease, and the contribution of Rext 115 and Iref 135 to the voltage at I/O pin 120 is reduced. Instead, the voltage at I/O pin 120 is primarily governed by the current ILeak1 265 from current source 260 and the internal resistor Rint 295, which determine a voltage on I/O pin 120.

While the resistance of Rext 115 is within the recommended range of resistances for the analog operating mode, between Rthr(low) and Rthr(high), ILeak2 245 from current source 240 compensates for errors introduced into Iout 140 by ILeak1 265. Diode 250 is coupled to the drain terminal of MP1 and current source 240, and to I/O pin 120. Diode 270 is coupled to current source 260 and to I/O pin 120. Diodes 250 and 270 act as reverse current protection while I/O pin 120 is coupled to a voltage source greater than Vcc 150.

A positive input of comparator 275 is coupled to I/O pin 120, and a negative input of comparator 275 is coupled to the reference voltage source Vmode1 310. Comparator 275 is configured to output a control signal CTL(mode 1) 280, which indicates the device should operate in a first digital mode of operation. A positive input of comparator 285 is coupled to I/O pin 120, and a negative input of comparator 285 is coupled to the reference voltage source Vmode2 320. Comparator 285 is configured to output a control signal CTL(mode 2) 290, which indicates the device should operate in a second digital mode of operation. While the resistance of Rext 115 is within the recommended range of resistances between Rthr(low) and Rthr(high), the device operates in the third mode (analog mode) of operation. CTL(mode 1) 280 and CTL(mode 2) 290 indicate the device is not operating in the digital modes of operation.

Figure 3:
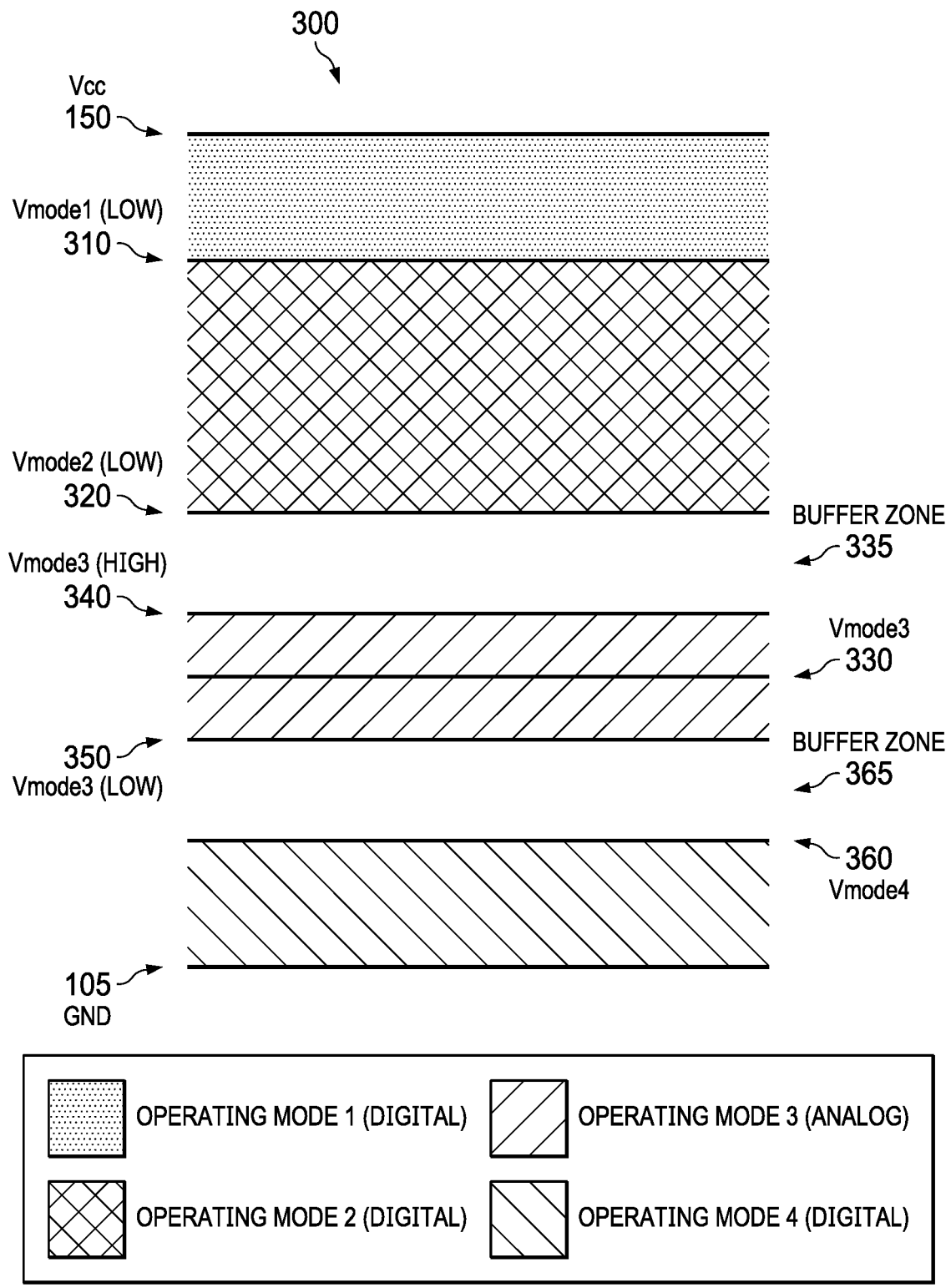
FIG. 3 shows a graph of voltages on the input/output pin shown in FIG. 2 and the corresponding mode of operation.

FIG. 3 shows a graph 300 of voltages on the I/O pin 120 shown in FIG. 2 and the corresponding mode of operation. The voltages shown in graph 300 range from the supply voltage Vcc 150 to ground 105. Table 1 illustrates the resistance of external resistor Rext 115, the corresponding voltage V_I/O on the I/O pin 120, and the operating mode.

example, a one milliAmpere (mA) current can be driven by a microcontroller (not shown) coupled to I/O pin 120, and the value of Rext(Mode1) is chosen to be approximately Vmode1(low) 310 divided by one mA. Node 117 is coupled to a supply voltage rail Vcc 150 or a voltage greater than Vcc 150. The voltage on I/O pin 120 is between Vcc 150 and a first threshold voltage Vmode1(low) 310 as indicated by the first entry in Table 1. In this example comparator 275 outputs CTL(mode 1) 280 and the device operates in the first digital mode of operation. Diodes 250 and 270 prevent reverse current from damaging components in I/O interface 200.

To enable the analog mode of operation, the resistance of Rext 115 is chosen to be within the recommended range of resistances defined by Rthr(low) and Rthr(high), and node 117 is coupled to ground 105. The R/I converter 100 maintains a substantially constant voltage Vmode3 330 on I/O pin 120 and the device operates in the third analog mode of operation. The voltage on I/O pin 120 can vary between Vmode3(high) 340 and Vmode3(low) 350 as indicated by the third entry of Table 1, but buffer region 335 between Vmode2(low) 320 and Vmode3(high) 340 and buffer region 365 between Vmode3(low) 350 and Vmode4 360 prevent the device from transitioning to another mode of operation inappropriately.

In I/O interface 200, the I/O pin 120 enables the device to transition between one analog and two digital operating modes. In other examples such as I/O interface 400 described herein with reference to FIG. 4, the principle of operation can be extended to more than two digital operating modes. In some implementations, the device can operate in a total of four operating modes: the analog mode, the first digital mode, the second digital mode, and a third digital mode.

TABLE 1

| Rext 115 | Connected to node 117 | Voltage at node 120 | Operating Mode |
| --- | --- | --- | --- |
| <Rext(Mode1) | Supply voltage rail >=Vcc 150 | >Vmode1(low) 310 | Digital mode 1 |
| >Rext(Mode2) | Vcc 150 Ground 105 | <Vmode1(low) 310 >Vmode2(low) 320 | Digital mode 2 |
| <Rext(Mode2) >Rthr(high) | Ground 105 | <Vmode2(low) 320 >Vmode3(high) 340 | Buffer Zone 335 |
| >Rthr(low) <Rthr(high) | Ground 105 | <Vmode3(high) 340 >Vmode3(low) 350 | Analog mode 3 |
| <Rthr(low) >Rext(Mode4) | Ground 105 | <Vmode3(low) 350 >Vmode4 360 | Buffer Zone 365 |
| <Rext(Mode4) | Ground 105 | <Vmode4 360 | Digital mode 4 |

To enable the second digital mode of operation, the resistance of Rext 115 is chosen to be at least some amount Rext(Mode2) greater than the upper threshold resistance Rthr(high) of the recommended range of resistances for the analog operating mode. Node 117 is coupled to ground 105 or supply voltage rail Vcc 150. The current ILeak1 from current source 260, the internal resistor Rint 295, and Rext 115 determine the voltage on I/O pin 120, which ranges between Vmode1(low) 310 and Vmode2(low) 320 as indicated by the second entry of Table 1. In this example, comparator 285 outputs CTL(mode 2) 290, such that the device operates in the second digital mode of operation.

To enable the first digital mode of operation, the resistance of Rext 115 is chosen to be less than a threshold resistance Rext(Mode1) for the first digital mode of operation. The value of the threshold resistance Rext(Mode1) is less than the resistance Rext(Mode2) for the second digital mode of operation, and can be chosen based on the drive strength of an external driver at the I/O pin 120. For To enable the third digital mode of operation, the resistance of Rext 115 is chosen to be less than a threshold resistance Rext(Mode4) for the third digital operating mode, and node 117 is coupled to ground 105. The voltage on I/O pin 120 is less than Vmode4 360 as indicated by the fourth entry of Table 1, and current source 205 prevents shoot-through current. The value of the threshold resistance Rext (Mode4) is less than the threshold resistance Rthr(low) for the analog mode of operation, and can be chosen based on the drive strength of an external driver at the I/O pin 120. For example, a one mA current can be driven by a microcontroller (not shown) coupled to I/O pin 120, and the value of Rext(Mode4) is chosen to be approximately Vmode4 360 divided by one mA.

Figure 4:
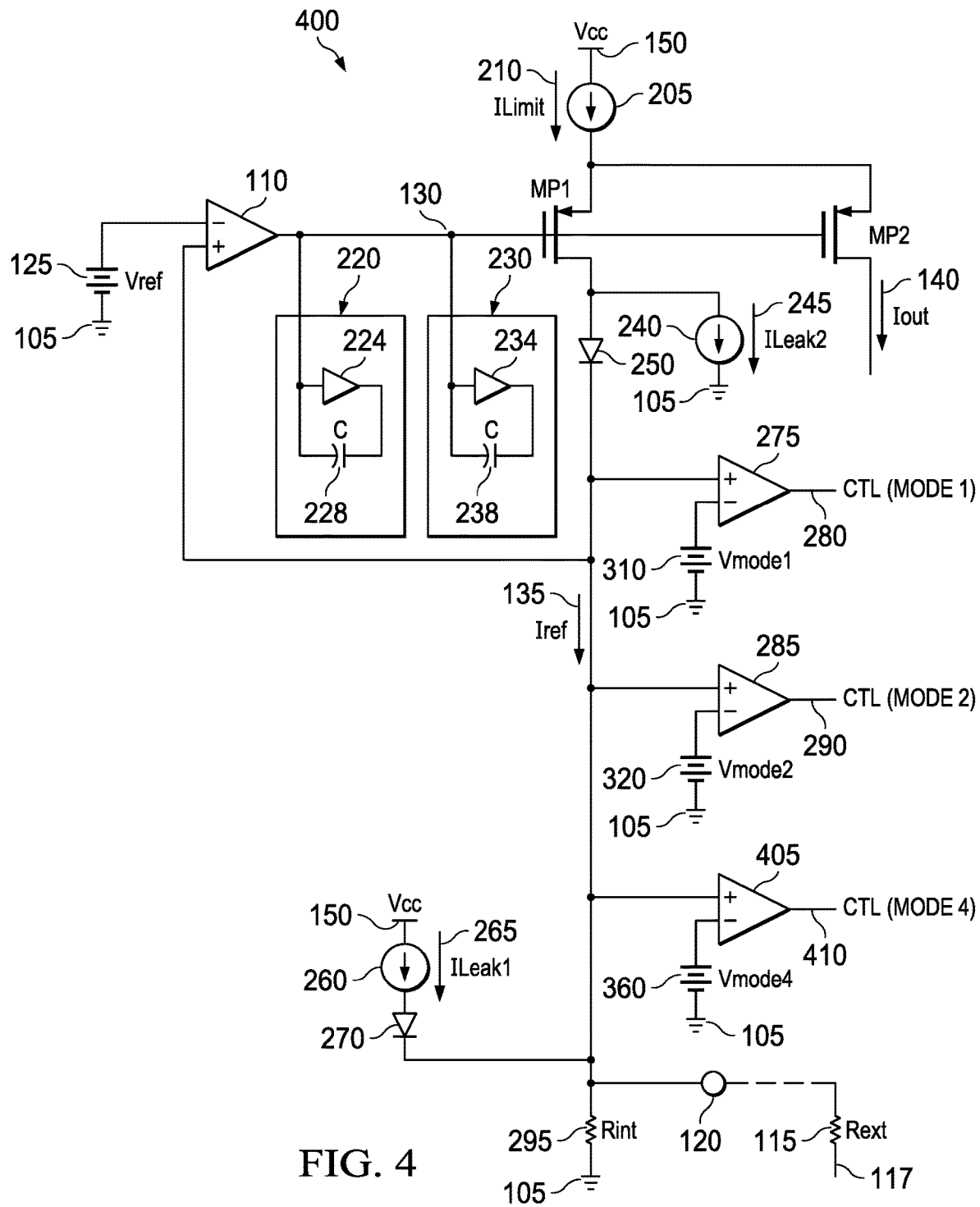
FIG. 4 is a circuit diagram illustrating a programmable input/output interface configured to support an analog mode of operation and three digital modes of operation on a single input/output pin.

To enable the third digital mode of operation for a total of four modes of operation, the I/O interface includes an additional comparator configured to output a third control signal. FIG. 4 illustrates a programmable I/O interface 400 configured to support an analog and three digital modes of operation on a single I/O pin 120. For ease of illustration, I/O interface 400 is described herein with reference to I/O interface 200 shown in FIG. 2. In addition, I/O interface 400 includes comparator 405. A positive input of comparator 405 is coupled to I/O pin 120 and a negative input of comparator 405 is coupled to a reference voltage source Vmode4 360 discussed herein with reference to FIG. 3. Comparator 405 outputs a control signal CTL(mode 4) 410 while the voltage on I/O pin 120 is less than Vmode4 360, and the device operates in the third digital mode of operation.

In this description, the term "couple" may cover direct and indirect connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

The uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

As used herein, the terms "terminal", "node" and "interconnection" are used interchangeably. Unless specifically stated to the contrary, these terms are generally used to mean an interconnection between or a terminus of a device element, a circuit element, an integrated circuit, a device or other electronics or semiconductor component. The term "pin" or "lead" are used interchangeably and are generally used to mean an interconnection from a semiconductor device to external components. Examples of a "pin" or "lead" include a ball of a ball grid array, a lead on a lead-frame, or a pin in a pin-grid array.

Modifications are possible in the described embodiments, and other embodiments are possible, within the scope of the claims.

What is claimed is:

1. A circuit having an input terminal adapted to be coupled to an external resistor having an external resistance, comprising:
    a resistance-to-current (R/I) converter circuit coupled to the input terminal and having a generated current output having a generated current based on the external resistance;
    an internal resistor coupled to the input terminal and to ground;
    a first current source coupled to the R/I converter circuit and operable to supply a first current;
    a first diode coupled to the R/I converter circuit and to the input terminal;
    a second current source coupled to the R/I converter circuit and the first diode and to ground, the second current source operable to supply a second current;
    a second diode coupled to the input terminal;
    a third current source coupled to the second diode and having an operable to supply a third current; and
    a comparator having a positive input coupled to the input terminal, a negative input coupled to a reference voltage, and a control signal output indicative of an operating mode.

2. The circuit of claim 1, wherein during an analog operating mode the external resistance is between an upper threshold resistance and a lower threshold resistance, and wherein during a digital operating mode the external resistance is greater than the upper threshold resistance or less than the lower threshold resistance.

3. The circuit of claim 2, wherein the reference voltage is a first reference voltage, and wherein the R/I converter circuit comprises:
    an error amplifier having a positive input coupled to the input terminal, a negative input coupled to a second reference voltage, and an output; and
    a current mirror coupled to the output of the error amplifier, the first diode, and the first current source, the current mirror having an output coupled to the generated current output of the R/I converter circuit.

4. The circuit of claim 3, further comprising a compensation loop coupled to the output of the error amplifier and configured to compensate for a capacitance on the input terminal.

5. The circuit of claim 4, wherein:
    the compensation loop is a first compensation loop;
    the upper threshold resistance and the lower threshold resistance define a recommended range of resistances for the analog operating mode;
    the circuit further comprises a second compensation loop coupled to the output of the error amplifier;
    the first compensation loop is configured to compensate for the capacitance on the input terminal for a first subset of the recommended range of resistances;
    the second compensation loop is configured to compensate for the capacitance on the input terminal for a second subset of the recommended range of resistances; and the first subset and the second subset of the recommended range of resistances are overlapping.

6. The circuit of claim 2, wherein the comparator is a first comparator, the reference voltage is a first reference voltage, the control signal is a first control signal, and the digital operating mode is a first digital operating mode, the circuit further comprising a second comparator having a positive input coupled to the input terminal, a negative input coupled to a second reference voltage, and an output for a second control signal indicative of a second digital operating mode.

7. The circuit of claim 6, wherein during the first digital operating mode the external resistance is less than a threshold resistance for the first digital operating mode and couples the input terminal to a supply voltage, wherein during the second digital operating mode the external resistance is greater than the upper threshold resistance, and wherein during the second digital operating mode a voltage on the input terminal is determined by the second current source, the internal resistor, and the external resistance.

8. The circuit of claim 6, further comprising a third comparator having a positive input coupled to the input terminal, a negative input coupled to a third reference voltage, and an output for a third control signal indicative of a third digital operating mode.

9. The circuit of claim 8, wherein during the third digital operating mode the external resistance is less than a threshold resistance for the third digital operating mode and couples the input terminal to ground.

10. A circuit operable to operate in an analog mode, a first digital mode and a second digital mode, the circuit comprising:
an I/O connection adapted to be coupled to an external resistance having an external resistance;
a resistance-to-current (R/I) converter coupled to the I/O connection, the R/I converter comprising:
an error amplifier having a first input adapted to be coupled to a first reference voltage, a second input coupled to the I/O connection, and an output; and
a current mirror coupled to the output of the error amplifier and having an output operable to indicate operation in the analog mode;
a first comparator having a first input coupled to the I/O connection, a second input adapted to be coupled to a second reference voltage and an output operable to indicate operation in the first digital mode; and
a second comparator having a first input coupled to the I/O connection, a second input adapted to be coupled to a third reference voltage and an output operable to indicate operation in the second digital mode.

11. The circuit of claim 10, wherein the external resistance determines whether the circuit operates in the analog mode, the first digital mode or the second digital mode, the circuit further comprising:
a first current source coupled to the R/I converter and to ground;
a second current source coupled to the I/O connection; and
an internal resistor coupled to the I/O connection and to ground, wherein the first current source, the internal resistor, and the external resistance determine a voltage V_I/O at the I/O connection in response to the external resistance being greater than the upper threshold resistance.

12. The circuit of claim 11, further comprising:
a first diode coupled to the R/I converter and the first current source and to the I/O connection; and
a second diode coupled between the second current source and the I/O connection, wherein the first and second diodes prevent reverse current in response to the voltage V_I/O being greater than a supply voltage.

13. The circuit of claim 10, wherein the R/I converter further comprises a compensation loop operable to compensate for a capacitance C_I/O on the I/O connection.

14. The circuit of claim 13, wherein the compensation loop is a first compensation loop, wherein the R/I converter further comprises a second compensation loop operable to compensate for the capacitance C_I/O, wherein the upper threshold resistance and the lower threshold resistance define a recommended range of resistances for the analog mode of operation, wherein the first compensation loop is operable to compensate for the capacitance C_I/O for a first subset of the recommended range of resistances, wherein the second compensation loop is operable to compensate for the capacitance C_I/O for a second subset of the recommended range of resistances, and wherein the first subset and the second subset are overlapping.

15. The circuit of claim 10, wherein a transceiver device comprises the circuit, wherein the analog mode of operation corresponds to an on-off keying (OOK) modulation communication mode, wherein the first digital mode of operation corresponds to a first digital communication mode, and wherein the second digital mode of operation corresponds to a second digital communication mode that is an inverse of the first digital communication mode.

16. A circuit having an I/O pin adapted to be coupled to an external resistor having an external resistance, comprising:
a resistance-to-current (R/I) converter coupled to the I/O pin and including:
an error amplifier having a positive input coupled to the I/O pin, a negative input coupled to a first reference voltage, and an output;
a first compensation loop coupled to the output of the error amplifier;
a second compensation loop coupled to the output of the error amplifier; and
a current mirror coupled to the output of the error amplifier and having an analog control signal output;
an internal resistor coupled to the I/O pin and to ground;
a first current source coupled to the current mirror;
a first diode coupled to the current mirror and to the I/O pin;
a second current source coupled to the current mirror and the first diode and to ground;
a second diode coupled to the I/O pin;
a third current source coupled to the second diode; and
a comparator having a positive input coupled to the I/O pin, a negative input coupled to a second reference voltage, and a digital control signal output.

17. The circuit of claim 16, wherein during an analog operating mode the external resistance is within a recommended range of resistances defined by an upper threshold resistance and a lower threshold resistance, and wherein during a digital operating mode the external resistance is outside the recommended range of resistances.

18. The circuit of claim 17, wherein:
the first compensation loop comprises:
a first buffer having an input coupled to the output of the error amplifier and an output, and
a first capacitor coupled between the input and the output of the first buffer;
the second compensation loop comprises:

a second buffer having an input coupled to the output of the error amplifier and an output, and a second capacitor coupled between the input and the output of the second buffer.

19. The circuit of claim 18, wherein a capacitance of the first capacitor corresponds to a first subset of the recommended range of resistances, wherein a capacitance of the second capacitor corresponds to a second subset of the recommended range of resistances, and wherein the first subset and the second subset are overlapping.

20. The circuit of claim 16, wherein the comparator is a first comparator and the digital control signal is a first digital control signal, the circuit further comprising:

a second comparator having a positive input coupled to the I/O pin, a negative input coupled to a third reference voltage, and a second digital control signal output, wherein the third reference voltage is less than the second reference voltage; and a third comparator having a positive input coupled to the I/O pin, a negative input coupled to a fourth reference voltage, and a third digital control signal output, wherein the fourth reference voltage is less than the first reference voltage.

* * * * *